United States Patent
Azzopardi et al.

(10) Patent No.: US 12,382,831 B2
(45) Date of Patent: Aug. 5, 2025

(54) MULTILEVEL THERMOELECTRIC COOLING STACK WITH THERMAL GUARD RINGS

(71) Applicant: UNIVERSITY OF MALTA, Msida (MT)

(72) Inventors: Marc Anthony Azzopardi, San Gwann (MT); Andre Micallef, Birbirkara (MT); Alec Fenech, Swieqi (MT)

(73) Assignee: UNIVERSITY OF MALTA, Msida (MT)

( * ) Notice: Subject to any disclaimer, the term of this patent is extended or adjusted under 35 U.S.C. 154(b) by 302 days.

(21) Appl. No.: 17/868,848

(22) Filed: Jul. 20, 2022

(65) Prior Publication Data
US 2024/0032425 A1    Jan. 25, 2024

(51) Int. Cl.
| | | |
|---|---|---|
| *H10N 10/13* | (2023.01) | |
| *H01L 23/38* | (2006.01) | |
| *H10N 19/00* | (2023.01) | |
| *H05K 1/18* | (2006.01) | |

(52) U.S. Cl.
CPC ............ *H10N 10/13* (2023.02); *H01L 23/38* (2013.01); *H10N 19/101* (2023.02); *H05K 1/181* (2013.01)

(58) Field of Classification Search
CPC ....... H10N 19/101; H10N 10/17; H10N 10/13
See application file for complete search history.

(56) References Cited

U.S. PATENT DOCUMENTS

| | | | | |
|---|---|---|---|---|
| 4,606,194 A | * | 8/1986 | Pirtle | F25B 9/14 60/520 |
| 4,833,889 A | | 5/1989 | Harwell et al. | |
| 5,022,928 A | * | 6/1991 | Buist | H10N 10/817 136/212 |
| 5,075,555 A | | 12/1991 | Woldseth et al. | |
| 5,456,081 A | * | 10/1995 | Chrysler | H10N 10/13 165/185 |
| 6,505,468 B2 | * | 1/2003 | Venkatasubramanian | F25B 21/02 62/331 |
| 6,711,904 B1 | * | 3/2004 | Law | H01L 23/34 62/3.2 |
| 7,051,536 B1 | * | 5/2006 | Cohen | B01L 3/50851 62/3.6 |
| 7,763,792 B2 | * | 7/2010 | Sharp | H10N 10/17 136/200 |
| 9,574,481 B2 | * | 2/2017 | Resch | F28D 21/0003 |
| 9,741,917 B2 | * | 8/2017 | Lee | H10N 10/17 |
| 9,793,462 B2 | * | 10/2017 | Kaibe | H10N 10/82 |

(Continued)

OTHER PUBLICATIONS

International Search Report for PCT/IB2023/051329 Mailed on May 25, 2023.

*Primary Examiner* — Filip Zec
(74) *Attorney, Agent, or Firm* — Rivka Friedman (57) ABSTRACT

A multilevel thermoelectric cooling (TEC) stack channels thermal power away from an element to be cooled which is mounted on a substrate such as a circuit board and may generate an intrinsic heat load. The TEC stack has an inner TEC level which is in direct or indirect thermal contact with the element and an outer TEC level. At least one of the TEC levels includes a shaped thermal guard ring which is in thermal contact with the substrate. The thermal guard ring(s) define isothermal boundaries on the substrate, and effectively channel, or "wick", thermal power away from the element to be cooled.

19 Claims, 3 Drawing Sheets

(56) References Cited

U.S. PATENT DOCUMENTS

| | | | | |
|---|---|---|---|---|
| 10,559,739 | B2* | 2/2020 | Azzouz | H10N 10/17 |
| 10,894,484 | B2* | 1/2021 | Han | B60L 53/67 |
| 11,148,546 | B2* | 10/2021 | Akaishi | B60L 58/12 |
| 11,333,709 | B2* | 5/2022 | Ito | G01R 31/371 |
| 11,892,204 | B2* | 2/2024 | Ghoshal | F25B 21/02 |
| 2003/0103745 | A1* | 6/2003 | Maier | G02F 1/01708 |
| | | | | 385/16 |
| 2010/0257871 | A1* | 10/2010 | Venkatasubramanian | |
| | | | | H01L 23/38 |
| | | | | 62/3.7 |
| 2011/0083446 | A1* | 4/2011 | Pinet | F25B 21/02 |
| | | | | 62/3.6 |
| 2012/0111386 | A1* | 5/2012 | Bell | H10N 10/00 |
| | | | | 700/297 |
| 2013/0139524 | A1 | 6/2013 | Kim et al. | |
| 2015/0077054 | A1* | 3/2015 | Uyeki | B60L 53/11 |
| | | | | 320/109 |
| 2016/0178678 | A1* | 6/2016 | Pelletier | G01R 21/1333 |
| | | | | 700/291 |
| 2017/0221862 | A1* | 8/2017 | Chou | H01L 23/38 |
| 2017/0345988 | A1* | 11/2017 | Kim | H10N 10/17 |
| 2019/0131203 | A1* | 5/2019 | Kang | H01L 23/4334 |

* cited by examiner

MULTILEVEL THERMOELECTRIC COOLING STACK WITH THERMAL GUARD RINGS

CROSS REFERENCES TO RELATED APPLICATIONS

This patent application is related to commonly owned US Patent Application entitled: Method And System For Power Optimization For System Of Thermoelectric Cooling Devices (Ser. No. 17/868,839), filed on the same day as this patent application, the disclosure of this patent application is incorporated by reference in its entirety herein.

TECHNICAL FIELD

The present disclosure relates to thermoelectric coolers (TECs or TEMs), and specifically, to multilevel thermoelectric cooling stacks.

BACKGROUND

Many imaging applications use an electronic element, such as a complementary metal oxide semiconductor (CMOS) or a charge-coupled device (CCD), which is sensitive to thermal noise. As a result, these semiconductors and/or CCDs require cooling to near-cryogenic temperatures in order to achieve optimal performance. Active cooling to such temperatures may be achieved using a multilevel thermoelectric cooling (TEC) stack, formed of two or more devices.

Each device includes solid state p-n junctions, between plates. The p-n junctions are typically connected electrically in series and connected thermally in parallel. One plate is a hot side and the other plate is the cold side, as the p-n junctions, when subject to an electric current, pump, or otherwise transfer heat from the cold side to the hot side. For example, a stack is formed with one device on top of the another, with the top device within the surface area of the bottom device. The top device has an exposed cold side, for receiving an element, such as an integrated circuit, to be cooled, and the bottom device has its hot side exposed.

The above described TEC stack exhibits numerous drawbacks, such as: thermal energy leaks from the ambient environment (or the higher TEC levels), in a direction toward the element. When the element to be cooled is a high pin-count electronic device, the number of conductors and of corresponding ground planes in a printed circuit board (PCB), on which the device is mounted, gives rise to a multiplicity of thermal conduction paths, resulting in thermal leakage reaching the element. In addition, there is a contribution to thermal leakage caused by thermal (blackbody) radiation. Regardless of the source, even small amounts of thermal leakage create a positive feedback mechanism, which further increases the power dissipation of the TEC levels. This makes the lowest levels of the stack considerably more vulnerable (than the higher levels) to any additional load created by thermal leaks.

Another drawback of the aforementioned TECs is that the TEC levels, which are distanced further from the element, not only dissipate more heat, but are also maintained at a higher temperature than those which are closer to the element. In general, thermal conduction increases linearly with the difference in temperature of two adjacent bodies, and thermal radiation as the difference in the fourth power of their temperatures. Therefore, the furthermost (in distance) layers, from the semiconductor and/or CCD are often the greatest contributors of thermal leakage by conduction and radiation.

SUMMARY OF THE DISCLOSURE

The present disclosure includes embodiments directed to multilevel thermoelectric cooling (TEC) stacks, each TEC stack including a plurality of successive of TEC levels, each level including a device with a guard ring extending from and running along the device periphery. The TEC stacks levels are layered one on top of the other, for channeling or "wicking" thermal power away from an element mounted on a substrate, such as a circuit board, and in communication with the uppermost TEC level, to be cooled. The element may generate an intrinsic heat load, which is transferred by the successive TEC levels to a heat sink, and from there, to the ambient or to a fluid, such as water, which may or may not be pre-chilled.

The disclosed multilevel thermoelectric cooling (TEC) stack channels thermal power away from an element to be cooled which is mounted on a substrate such as a circuit board and may generate an intrinsic heat load. The TEC stack has an inner TEC level which is in direct or indirect communication, including thermal communication including, for example, thermal contact, with the element and an outer TEC level. At least one of the TEC levels includes a shaped thermal guard ring which is in thermal contact with the substrate. The thermal guard ring(s) define isothermal boundaries on the substrate, and effectively channel, or "wick", thermal power away from the element to be cooled. The thermal guard ring(s) may be fitted with thermal radiation shield(s). The guard ring temperature(s) are adjusted by an external TEC power supply and controller, in order to minimize the total electrical power consumed by the stack while keeping the element at or below a threshold temperature.

Unless otherwise defined herein, all technical and/or scientific terms used herein have the same meaning as commonly understood by one of ordinary skill in the art to which the disclosure pertains. Although methods and materials similar or equivalent to those described herein may be used in the practice or testing of embodiments of the disclosure, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the present disclosure are herein described, by way of example only, with reference to the accompanying drawings. With specific reference to the drawings in detail, it is stressed that the particulars shown are by way of example and for purposes of illustrative discussion of embodiments of the disclosure. Dimensions of components and features shown in the figures are chosen for convenience and clarity of presentation and are not necessarily shown to scale. The description taken with the drawings makes apparent to those skilled in the art how embodiments of the disclosure may be practiced.

Attention is now directed to the drawings, where like reference numerals or characters indicate corresponding or like components. In the drawings.

DETAILED DESCRIPTION OF THE DRAWING FIGURES

The disclosed subject matter provides a multilevel thermoelectric cooling (TEC) stack, which channels thermal power away from an element to be cooled which is mounted on a substrate such as a circuit board, and is responsive to the element generating an intrinsic heat load. The TEC stack has an inner TEC level which is in direct or indirect thermal contact with the element and an outer TEC level. At least one of the TEC levels includes a shaped thermal guard ring which is in thermal contact with the substrate. The thermal guard ring(s) define isothermal boundaries on the substrate, and effectively channel, or "wick", thermal power away from the element to be cooled. The thermal guard ring(s) may be fitted with thermal radiation shield(s). The guard ring temperature(s) are adjusted by an external TEC power supply and controller, in order to minimize the total electrical power consumed by the stack while keeping the element at or below a threshold temperature.

Figure 1A:
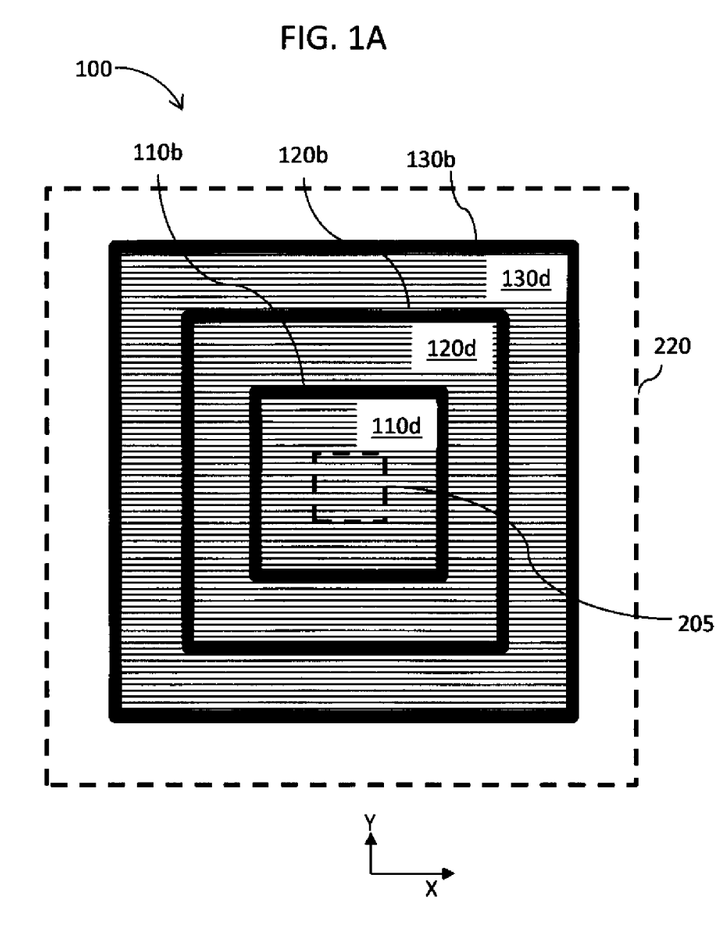
FIGS. 1A and 1B are cross-sectional diagrams of an exemplary multilevel TEC stack, according to an embodiment of the disclosure.
Figure 1B:
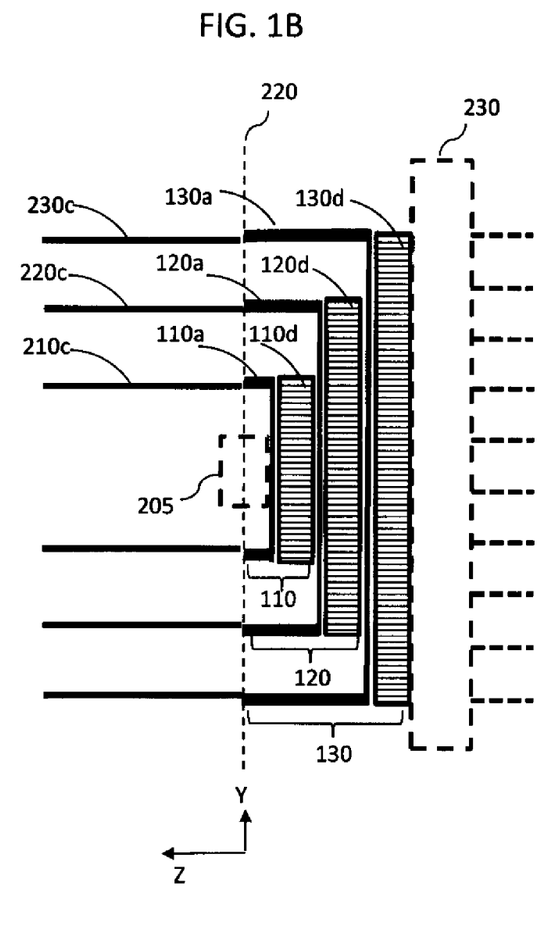

FIGS. 1A and 1B are cross-sectional diagrams of an apparatus, a multilevel thermoelectric cooling (TEC) stack 100, according to an embodiment of the disclosed subject matter. The TEC stack 100 includes at least two and, for this example, three, TEC levels 110, 120, 130. These example levels include an inner level 110, which includes a TEC device 110d, an intermediate level 120; which includes a TEC device 120d, and, an outer level 130; which includes a TEC device 130d. Each TEC device typically consists of a multiplicity of Peltier junctions sandwiched between plates, whose temperature difference is controlled by electrical currents supplied to the TEC devices by an external power supply.

Shaped thermal guard rings 110d, 120d, and 130d are positioned proximate to, and extend at least partially along, the periphery of the corresponding TEC levels 110, 120, and 130. The guard rings are, for example, in thermal contact with a substrate 220, such as a circuit board (shown in broken lines), and form corresponding isothermal boundaries, or isotherms, 110b, 120b, and 130b on the circuit board 220. The isotherms are configured to set up a geometrical temperature distribution on the substrate 220, so as to direct the flow of heat away from the element 205 and towards a heat sink 230 (both shown in broken lines). The latter releases the heat, for example, to an ambient environment.

The geometric temperature distribution is defined by the ring temperatures (T1 for ring 110a, T2 for ring 120a, and T3 for ring 130a) and T5 for the ambient. The temperature differences (T2−T1, T3−T2, and T5−T3) are controllable by the electrical currents flowing in each of the TEC levels 110, 120, 130. The greater the current applied to a TEC level, the larger is temperature difference for that TEC level.

In FIG. 1A, the isotherms 110b, 120b, 130b, are shown, for example, as having a rectangular shape. Alternately, other shapes are suitable for these isotherms, such as polygonal, elliptical, circular, any closed or partially closed curve, or combinations thereof, provided that the thermal gradients established by the isotherms direct the flow of heat away from the element 205.

The guard rings 110a, 120a, 130a are, for example, of a thermally conductive material, such as a thermally conductive ceramic, a metal or metal alloy. For example, the material of the guard rings is of a thermal conductivity which is greater than or equal to 100 watts per meter per degree Celsius (W/m/° C.) within the temperature range of, for example, approximately −20° C. to approximately −100° C. Example materials meeting the aforementioned thermal conductivity, at the aforementioned predetermined temperature, include gold, silver, aluminum, copper, boron nitride, and aluminum nitride. Furthermore, the guard rings 110a, 120a, 130a, for example, may be structured as solid materials or as vapor chambers, such as heat pipes.

Turning now to FIG. 1B the apparatus, the TEC stack 100, is shown with an element 205, such as an integrated circuit, mounted on a substrate, such as a circuit board 220. The element 205 is in thermal communication with the outer (or uppermost) TEC level 110. The circuit board 220 is, for example, parallel to the X-Y plane and perpendicular to the Z-axis. The element 205 may be surface-mounted to the circuit board 220, for example, by a ball-grid-array (BGA) which is bonded to multiple, typically on the order of hundreds, of contacts on the circuit board 220. The contacts, for example, act as electrical conductors and also as thermal conductors, enabling a flow of heat between the element 205 and one or more conducting planes inside the circuit board 220. The geometric temperature distribution across the surface of board 220 determines whether heat flows towards, or away from, the element 205.

Thermal radiation shields 210c, 220c, 230c extend from the circuit board 220. The radiation shields 210c, 220c, 230c, are in communication, for example, thermal contact, with the respective thermal guard rings 110a, 120a, 130a, so as to at least partially surround the element 205 (with the innermost guard ring 110a and its radiation shield 210c at least partially surrounding the element 205). The radiation shields 210c, 220c, 230c, for example, on their sides facing away from the element 205, include a reflective layer, for example, gold, silver, brass, copper or aluminum. Alternately, the material of the reflective layer has a reflectivity which is, for example, in the range of 0.95 to 1.00 over a predetermined spectral range which depends upon the ambient temperature of objects within line of sight of element 205.

The threshold reflectivity and the spectral range are governed by the physics of thermal radiation, which is emitted by all bodies at a temperature above absolute zero (0 Kelvin), equal to approximately −273° C. The total thermal power, P, radiated by a perfect black body is equal to $\sigma A(T+273)^4$, where P is in watts, T is the temperature of the body in degrees C., A is the surface area of the body in square centimeters ($cm^2$) and $\sigma$ is the Stefan-Boltzmann constant, equal to $5.67 \times 10^{-12}$ watts/($cm^2$-$K^4$). For example, for a black body of area A=10 $cm^2$ and temperature T=20° C., the total thermal power is P=0.42 watts. Of this total power, roughly 50%, or 0.21 watts, is emitted at wavelengths less than 14 μm. For this example, a radiation shield having a 95% reflectivity in the spectral range below 14 μm would block approximately 0.95×0.21=0.2 watts of thermal radiation from reaching the element 205.

Figure 2:
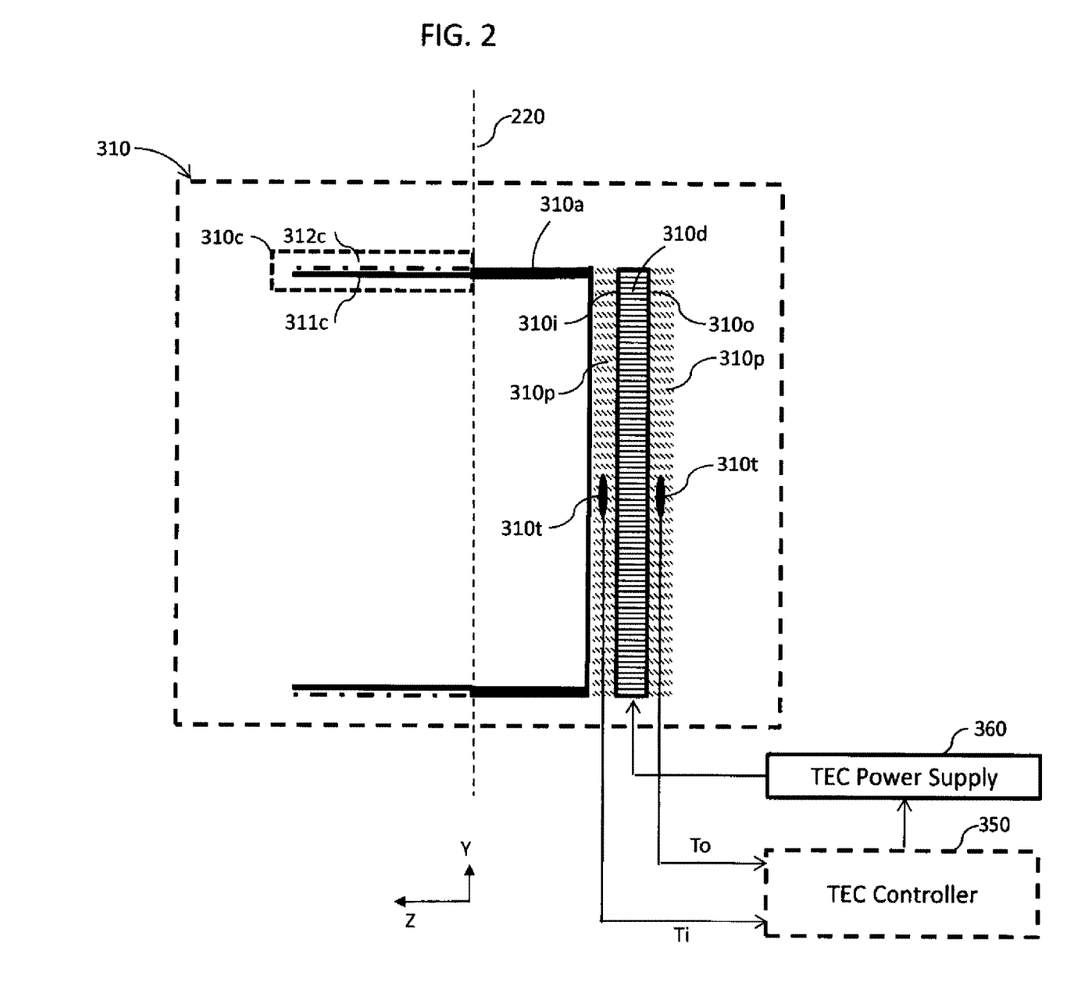
FIG. 2 is a side view of an exemplary TEC level, according to the principles of the disclosure; and, FIGS. 3A and 3B are thermal diagrams corresponding to the embodiment of FIGS. 1A and 1B.

FIG. 2 is a side view, taken along the X-axis, of an exemplary TEC level 310. A TEC device 310d is in thermal communication with a shaped thermal guard ring 310a. Temperature sensors 310t provide temperature readings Ti and To at the inner 310i and outer 310o surfaces of the TEC device 310d. The temperature readings are output to an external TEC controller, for example, by a wired connection, a fiber-optic cable, or a wireless connection. The connections between external devices, such as a TEC controller 350 (shown in dashed lines) and a TEC power supply 360, and the TEC level 310 are designed to prevent, or at least to minimize, the possibility of thermal leakage from the external devices towards the TEC level 310, the circuit board 220, or the heat sink 230. For example, fiber-optics and/or capacitive coupling between the TEC controller 350 and the TEC level 310 may be used, instead of electrical wires, in order to prevent a source of thermal leakage caused by thermal conduction through the wires.

The TEC controller 350 operates in conjunction with the TEC power supply 360 that is operably connected to the TEC devices at each TEC level, for the purpose of adjusting the temperature distribution between the TEC levels (thereby altering the effective Coefficient of Performance (COP) of each level), to reduce the electrical power required from the TEC power supply, while maintaining the element at the desired temperature. The process is computer-implemented, and functions to minimize the total electrical power consumed by the TEC levels 110, 120, 130 of the TEC stack 100, to maintain a desired temperature for the element 205, the computer-implemented process is detailed, for example, in commonly owned patent application entitled: Method And System For Power Optimization For System Of Thermoelectric Cooling Devices (Ser. No. 17/868,839).

In other embodiments, a layer of thermally conductive interface material 310p is applied on either side of the TEC device 310d, in order to reduce the thermal contact resistance at the interfaces with adjacent components. For example, when the TEC level 310 represents the intermediate TEC level 120, the inner surface 310i is adjacent to TEC level 110 and the outer surface 310o is adjacent to TEC level 130.

TEC device 310 may be implemented, for example, using Peltier modules produced by CUI Devices, which are available in a variety of sizes and heat flux capacities. Temperature sensor 310t may be, for example, a Cernox® thin film resistance cryogenic temperature sensor produced by Lakeshore Cryotronics, Inc, Westerville Ohio 43082, USA, which covers a temperature range of, for example, from −272° C. to 147° C. The thermally conductive interface material 310p may be for example, Apiezon® N grease, available from Lakeshore Cryotronics, which has low vapor pressure and high thermal conductivity and solidifies below 30° C. In other embodiments, the guard ring 310a is in thermal contact with a shaped thermal radiation shield 310c. FIG. 2 shows an exemplary thermal radiation shield 310c which includes a shield substrate 311c coated with a reflective layer 312c. The reflective layer is applied at least on the surfaces of the shield substrate 311c that face away from the element. In an alternative embodiment, the shield substrate may be an integral part of the guard ring itself, and the reflective layer may be one or more highly polished surfaces of the shield substrate.

Figure 3A:
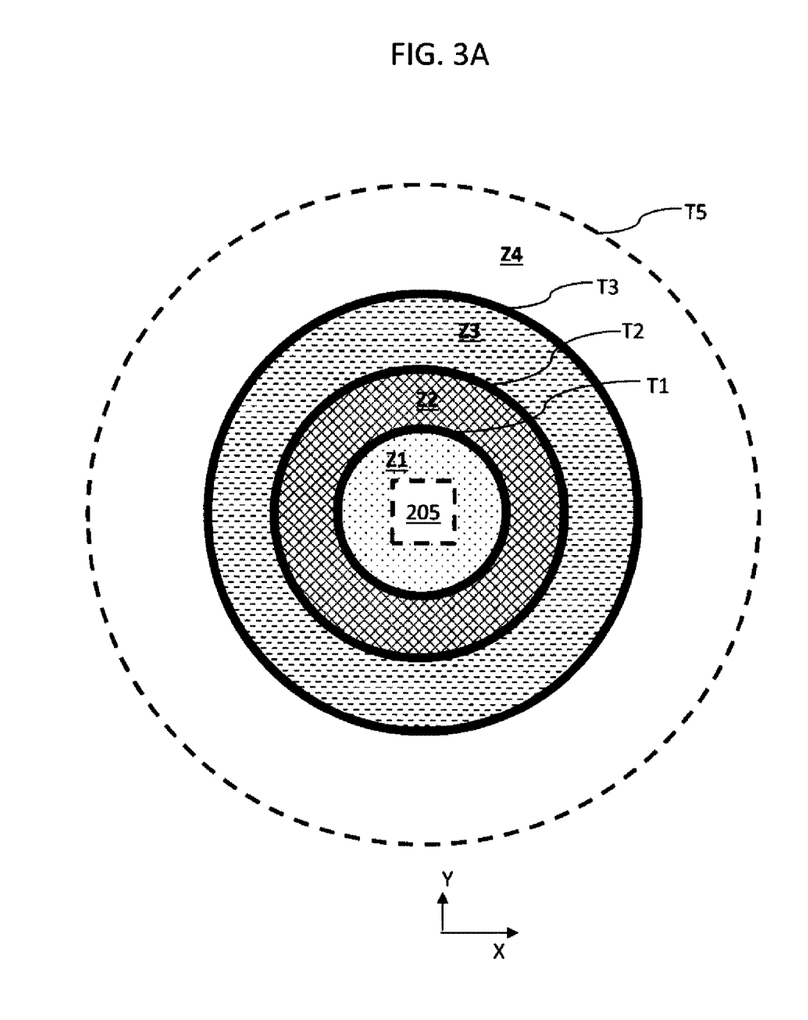
Figure 3B:
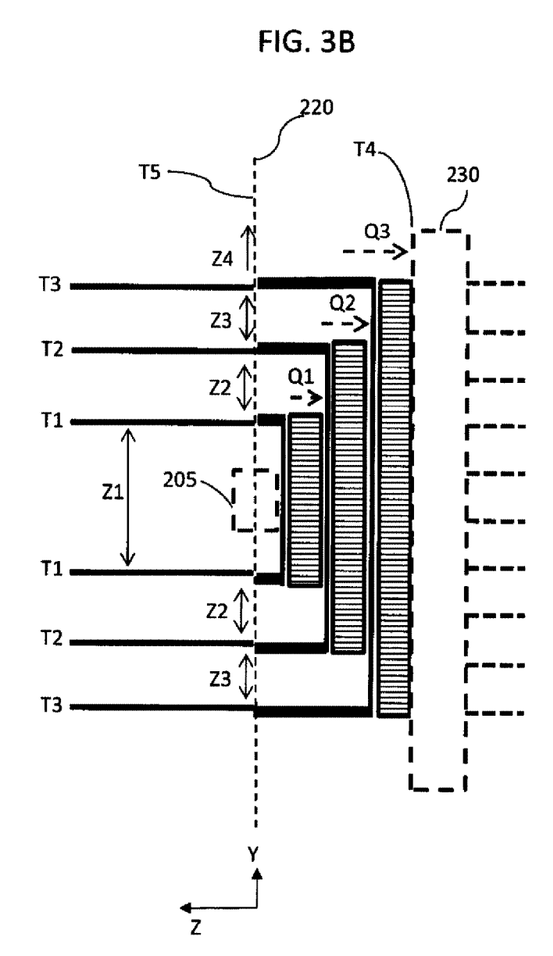

FIGS. 3A and 3B are thermal diagrams corresponding to the embodiment of FIGS. 1A and 1B, in which the isothermal boundaries 110b, 120b, and 130b are concentric circles, rather than rectangles. In FIG. 3A, an inner zone Z1 and intermediate zones Z2 and Z3 are areas on the circuit board 220 which are bounded by the isothermal boundaries 110b, 120b, and 130b at temperatures T1, T2, and T3 respectively. Outer zone Z4 is the area on the circuit board 220 that is external to the outermost isothermal boundary 130b and is assumed to be at an ambient temperature T5. In FIG. 3B, Q1, Q2, and Q3 denote the heat fluxes, in units of watts, which are pumped away from the element 205 by TEC devices 110d, 120d, and 130d, respectively. The values of Q1, Q2, and Q3 are generally positive in the direction indicated by the dashed arrows. The element 205 is kept at temperature T1, and the heat sink 230, which delivers the total heat flux produced by the element and the entire TEC stack to the ambient environment, is at temperature T4. Typically, T1<T2<T3<T5<T4.

In other embodiments, a fan may be used to facilitate the removal of heat by convection between the heat sink and the ambient air (environment). Alternatively, the heat sink may be designed to have chilled water flowing through it in conductive pipes. In the latter case, the temperature of the heat sink T4 is significantly lower than that of the ambient temperature T5.

Operational Example

A TEC stack with three levels was produced in accordance with FIGS. 3A and 3B. The element 205 is mounted at the center of the inner zone Z1, whose radius is R1=1.5 centimeters (cm). The intermediate zone Z2 is an annulus with inner radius R1 and an outer radius R2=2.75 cm. The intermediate zone Z3 is an annulus with the inner radius R2 and an outer radius R3=4.0 cm. Outer zone Z4 has inner radius R3, and extends radially outwards from zone Z3.

The stack includes three TEC levels with one TEC device per level. The inner TEC level is in thermal communication with zone Z1 and zone Z2. The intermediate TEC level is in thermal communication with zone Z2 and zone Z3, and the outer TEC level is in thermal communication with zone Z3 and zone Z4.

In order to maintain element 205 at a low operating temperature, the external TEC controller measures temperatures T1, T2, T3, and T4, shown in Table 1 below as having the values −60, −30, 0, and +30° C., respectively. The TEC controller then issues commands to the TEC power supply so as to maintain the temperature difference T2−T1, T3−T2, and T4−T3, at a desired value of 30° C. The circuit board 220 is assumed to have a single copper plane with a thickness of 35 microns and an effective radial thermal resistance equal to 11.12° C./W between isothermal boundaries 110b and 130b. Furthermore, each of the three TEC devices is assumed to operate with a coefficient of performance (COP) approximately equal to 0.6.

The heat fluxes are calculated using analytical methods which are facilitated by the circular symmetry and may also be checked numerically by using a finite-element thermal simulation. Table 1 shows the thermal performance of a prior-art TEC stack, which does not use the shaped thermal guard rings disclosed in the present disclosure, in the case when element 205 generates an intrinsic heat load of 1.0 watt.

TABLE 1

| TEC Level | Temperature °C. Ti | To | Input Heat Flux (W) | Leakage Heat Flux (W) | Effective Input Heat Flux (W) | Electrical Power (W) | Output Heat Flux (W) |
|---|---|---|---|---|---|---|---|
| Inner | −60 | −30 | 1.0 | 5.98 | 7.0 | 11.9 | 18.8 |
| Intermediate | −30 | 0 | 18.8 | | 18.8 | 32.0 | 50.8 |
| Outer | 0 | +30 | 50.8 | | 50.8 | 86.3 | 137.1 |
| Total Electrical Power: | | | | | | 130.2 | |

The leakage heat flux in the inner TEC level 110 is caused by heat flow from the ambient environment, mainly through the circuit board, and this greatly increases the effective heat load that must be pumped by the inner TEC level. The electrical power consumed by each TEC level appearing in the penultimate column of Table 1 is equal to the effective input heat flux divided by the COP of the TEC device, which is approximately 0.6. The output heat flux incorporates the effective input heat flux and the electrical power and becomes the input heat flux for the subsequent level. The total electrical power required by the prior-art TEC stack is found to be 130.2 watts.

Table 2 shows the thermal performance of a TEC stack which is fitted with shaped thermal guard rings, as per the disclosed subject matter. By comparison with Table 1, the leakage heat flux in the inner TEC level 110 is substantially reduced, because the guard rings prevent heat generated by the other TEC levels as well as heat from the ambient environment from reaching the inner TEC level. It is believed that the reason for this may be that the maximum temperature difference seen by each of the three TEC levels is only 30° C., because the guard rings effectively isolate the TEC devices from each other—not by thermal insulation, as in the prior art TEC stacks, but rather, by the thermal "wicking" provided by the highly conducting thermal guard rings. The electrical power appearing in the penultimate column of Table 2 is calculated in the same way as in Table 1, by dividing the effective heat load by the COP of approximately 0.6. The total electrical power required by the TEC stack is found to be just 118.6 watts, which is 10% less than that required by the prior-art TEC stack.

TABLE 2

| TEC Level | Temperature °C. Ti | To | Input Heat Flux (W) | Leakage Heat Flux (W) | Effective Input Heat Flux (W) | Electrical Power (W) | Output Heat Flux (W) |
|---|---|---|---|---|---|---|---|
| Inner | −60 | −30 | 1.0 | 4.36 | 5.4 | 9.1 | 14.5 |
| Intermediate | −30 | 0 | 14.5 | 7.06 | 17.2 | 29.1 | 46.3 |
| Outer | 0 | +30 | 46.3 | 8.11 | 47.4 | 80.4 | 127.7 |
| Total Electrical Power: | | | | | | 118.6 | |

EXAMPLES

Example 1

A multilevel thermoelectric cooling (TEC) apparatus comprises: a first thermoelectric cooling (TEC) level comprising a TEC device and a guard ring extending from the TEC device at a periphery of the TEC device, the TEC device configured for receiving an element to be cooled within the periphery; a second TEC level in thermal communication the first TEC level, the second TEC level comprising a TEC device whose periphery extends beyond the periphery of the device of the first TEC level and a guard ring extending from the TEC device of the second TEC level in the direction in which the guard ring of the first TEC level extends; each said thermal guard ring forming an isothermal for the respective TEC device; and, a power supply in electrical communication with the device of at least one of the first TEC level or second TEC level, to provide power to each said device and cause heat to flow in the direction from the first TEC level to the second TEC level.

Example 2

The multilevel thermoelectric cooling (TEC) apparatus of Example 1, wherein each TEC device includes oppositely disposed hot and cool sides, and the device of the first TEC level at the hot side is in thermal communication with the cool side of the device of the second TEC level.

Example 3

The multilevel thermoelectric cooling (TEC) apparatus of Example 1 or Example 2, wherein the first TEC level is configured to at least partially surround the element to be cooled.

Example 4

The multilevel thermoelectric cooling (TEC) apparatus of any of Example 1 to Example 3, additionally comprising at least one intermediate TEC level between the first TEC level and the second TEC level, the intermediate TEC level comprising a TEC device whose periphery extends between the periphery of the device of the first TEC level and the periphery of the device of the second TEC level and a guard ring extending from the TEC device of the intermediate TEC level in the direction in which the guard ring of the first TEC level and the guard ring of the second TEC level extend.

Example 5

The multilevel thermoelectric cooling (TEC) apparatus of any of Example 1 to Example 4, additionally comprising: a substrate in communication with each said guard ring.

Example 6

The multilevel thermoelectric cooling (TEC) apparatus of any of Example 1 to Example 5, wherein the substrate comprises a material selected from a group consisting of ceramic, glass, metal, wood, paper, plastic, foam, and crystalline substances.

Example 7

The multilevel thermoelectric cooling (TEC) apparatus of any of Example 1 to Example 6, wherein the substrate comprises a circuit board.

Example 8

The multilevel thermoelectric cooling (TEC) apparatus of any of Example 1 to Example 7, wherein at least one of the guard rings comprises a material having a thermal conductivity which is greater than 100 watts per meter per degree Celsius at a predetermined threshold temperature, for example, a range of approximately −20° C. to approximately −100° C.

Example 9

The multilevel thermoelectric cooling (TEC) apparatus of any of Example 1 to Example 8, wherein, at least one of the guard rings is structured as a solid material, a vapor chamber, or a heat pipe.

Example 10

The multilevel thermoelectric cooling (TEC) apparatus of any of Example 1 to Example 9, wherein at least one of the guard rings comprises a metal or metal alloy which includes a material selected from a group consisting of gold, silver, aluminum, copper, boron nitride, and aluminum nitride.

Example 11

The multilevel thermoelectric cooling (TEC) apparatus of any of Example 1 to Example 10, additionally comprising at least one thermal radiation shield in communication with at least one of said guard rings.

Example 12

The multilevel thermoelectric cooling (TEC) apparatus of any of Example 1 to Example 11, wherein the at least one shaped thermal radiation shield is in thermal comprises at least one reflective surface.

Example 13

The multilevel thermoelectric cooling (TEC) apparatus of any of Example 1 to Example 12, wherein the at least one thermal radiation shield comprises a material selected from a group consisting of gold, silver, copper, brass, molybdenum, nickel, platinum, tungsten, bismuth, zinc, lead, tin, mercury, and aluminum.

Example 14

The multilevel thermoelectric cooling (TEC) apparatus of any of Example 1 to Example 13, wherein the at least one reflective surface comprises a material having a thermal emissivity less than or equal to 0.05 over a predetermined range of thermal wavelengths.

Example 15

The multilevel thermoelectric cooling (TEC) apparatus of any of Example 1 to Example 14, additionally comprising a temperature sensor in communication with each said TEC level.

Example 16

The multilevel thermoelectric cooling (TEC) apparatus of any of Example 1 to Example 15, additionally comprising a heat sink in communication with the second TEC level, the heat sink configured for causing a total heat flux produced by the element and the stack of TEC devices to flow to the ambient environment or to a pre-chilled heat transfer fluid.

Example 17

The multilevel thermoelectric cooling (TEC) apparatus of any of Example 1 to Example 16, wherein the element to be cooled is in communication with external devices using fiber-optics and/or capacitive coupling.

Example 18

The multilevel thermoelectric cooling (TEC) apparatus of any of Example 1 to Example 17, additionally comprising: an external TEC controller in communication with each said temperature sensor, the TEC controller configured to select a temperature differential for each of two or more TEC levels, such that a temperature of one or more of the guard rings is adjusted to minimize a total electrical power required from the power supply, while keeping the element at or below a predetermined threshold temperature of, for example, between approximately 10° C. and approximately −150° C.

Although the disclosure has been described in conjunction with specific embodiments, many alternatives, modifications, and variations will be apparent to those skilled in the art. Accordingly, the disclosure is intended to embrace all such alternatives, modifications, and variations that fall within the spirit and broad scope of this disclosure.

The invention claimed is:

1. A multilevel thermoelectric cooling (TEC) apparatus comprising:
   a first thermoelectric cooling (TEC) level comprising a first TEC device and a first guard ring, the first guard ring configured for extending from the first TEC device at a periphery of the first TEC device, the first TEC device configured for receiving an element within the periphery to be cooled;
   a second TEC cooling level in thermal communication with the first TEC cooling level, the second TEC cooling level comprising a second TEC device in a stacked arrangement with the first TEC device, the second TEC device including a periphery extending beyond the periphery of the first TEC device of the first TEC cooling level and a second guard ring configured for extending from the second TEC device of the second TEC cooling level in the direction in which the guard ring of the first TEC cooling level extends, wherein the first guard ring and the second guard ring extend substantially parallel to each other to a plane;

each of said first and second guard rings forming an isothermal boundary for the respective first and second TEC device;

a power supply in electrical communication with the first and the second TEC devices of the respective first TEC cooling level and the second TEC cooling level, to provide power to each said TEC device and cause heat to flow from the element through each of the first and second guard rings to be channeled along the plane from the first TEC cooling level to the second TEC cooling level; and a controller in communication with the power supply and configured to adjust the temperature distribution between the stack of the first TEC cooling level and the second TEC cooling level, for minimizing the total electrical power consumed by the stack of the first TEC cooling level and the second TEC cooling level, by keeping the element at or below a threshold temperature.

2. The apparatus of claim 1, wherein each said first and second TEC device includes oppositely disposed hot and cool sides, and the first TEC device of the first TEC level at the hot side is in communication with the cool side of the second TEC device of the second TEC level.

3. The apparatus of claim 1, wherein the first TEC level is configured to at least partially surround the element.

4. The apparatus of claim 3, wherein the first TEC level is configured to surround the element to be cooled.

5. The apparatus of claim 1, additionally comprising at least one intermediate TEC level between the first TEC level and the second TEC level, the intermediate TEC level comprising a TEC device whose periphery extends between the periphery of the device of the first TEC level and the periphery of the device of the second TEC level, and a guard ring extending from the TEC device of the intermediate TEC level in the direction in which the guard ring of the first TEC level and the guard ring of the second TEC level extend to the plane, and are substantially parallel to each other, the TEC device for the intermediate TEC level in the stacked arrangement with the first and the second TEC devices.

6. The apparatus of claim 5, additionally comprising a heat sink in communication with the second TEC level, the heat sink configured for causing a total heat flux produced by the element and the stack of TEC devices to flow to the ambient environment or to a pre-chilled heat transfer fluid.

7. The apparatus of claim 5, wherein the element to be cooled is in communication with external devices using fiber-optics and/or capacitive coupling.

8. The apparatus of claim 1, wherein at least one of said guard rings comprises a material having a thermal conductivity which is greater than 100 watts per meter per degree Celsius at a predetermined threshold temperature.

9. The apparatus of claim 1, wherein at least one of said guard rings comprises one or more of a solid material, a vapor chamber, and a heat pipe.

10. The apparatus of claim 1, wherein at least one of said guard rings comprises a metal or metal alloy selected from a group consisting of gold, silver, aluminum, copper, boron nitride, and aluminum nitride.

11. The apparatus of claim 1, additionally comprising at least one thermal radiation shield in communication with at least one of said guard rings.

12. The apparatus of claim 11, wherein the at least one thermal radiation shield comprises at least one reflective surface.

13. The apparatus of claim 12, wherein the at least one reflective surface comprises a material having a thermal emissivity less than or equal to 0.05 over a predetermined range of thermal wavelengths.

14. The apparatus of claim 11, wherein the at least one thermal radiation shield comprises a material selected from a group consisting of gold, silver, copper, brass, molybdenum, nickel, platinum, tungsten, bismuth, zinc, lead, tin, mercury, and aluminum.

15. The apparatus of claim 1, additionally comprising a temperature sensor in communication with each said TEC level.

16. The apparatus of claim 15, wherein the controller is in communication with each said temperature sensor, the controller configured to select a temperature differential for each of two or more TEC levels, such that a temperature of one or more of the guard rings is adjusted to minimize a total electrical power required from the power supply, while keeping the element at or below a predetermined threshold temperature.

17. The apparatus of claim 16, further configured to execute a computer-implemented process for minimizing the total electrical power required from the power supply.

18. The apparatus of claim 1, additionally comprising a substrate positioned along the plane in communication with the first and second guard rings.

19. The apparatus of claim 18, wherein the substrate comprises a material selected from a group consisting of ceramic, glass, metal, wood, paper, plastic, foam, and crystalline substances.

* * * * *